United States Patent
Somervell

(10) Patent No.: US 8,263,309 B2
(45) Date of Patent: Sep. 11, 2012

(54) COMPOSITION AND METHOD FOR REDUCING PATTERN COLLAPSE

(75) Inventor: Mark H. Somervell, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 194 days.

(21) Appl. No.: 12/751,393

(22) Filed: Mar. 31, 2010

(65) Prior Publication Data

US 2011/0244391 A1   Oct. 6, 2011

(51) Int. Cl.
*G03F 7/00* (2006.01)
*G03F 7/004* (2006.01)

(52) U.S. Cl. ..................... 430/270.1; 430/905

(58) Field of Classification Search ............. 430/270.1, 430/905
See application file for complete search history.

(56) References Cited

U.S. PATENT DOCUMENTS

| 5,374,502 | A | 12/1994 | Tanaka et al. |
| 7,238,653 | B2 | 7/2007 | Lee et al. |
| 7,537,880 | B2 | 5/2009 | Harada et al. |
| 8,080,363 | B2 * | 12/2011 | Kanda ................. 430/270.1 |
| 2007/0134588 | A1 * | 6/2007 | Kanda et al. ......... 430/270.1 |
| 2008/0187860 | A1 | 8/2008 | Tsubaki et al. |
| 2009/0111054 | A1 | 4/2009 | Iwashita et al. |
| 2009/0239176 | A1 * | 9/2009 | Kanda ................... 430/285.1 |

FOREIGN PATENT DOCUMENTS

| EP | 1795960 A2 * | 6/2007 |
| WO | 2005010620 A1 | 2/2005 |

OTHER PUBLICATIONS

Ferreira et al., The Stereoselective Alkylation and Conformational Analysis of 14-membered Lactones, Can. J. Chem., vol. 65, (1987), 2 pp.

Reese, Solutions to Resist Pattern Collapse for 45 nm Lithography, 24th Annual Microelectronic Engineering Conference, May 2006, pp. 25-29.

* cited by examiner

*Primary Examiner* — Amanda C. Walke
(74) *Attorney, Agent, or Firm* — Wood, Herron & Evans, LLP

(57) ABSTRACT

A radiation-sensitive composition and method for using the composition to reduce the probability of pattern collapse is provided. The radiation-sensitive composition includes a bulk matrix of radiation-sensitive material with a base-reactive, surface-modifying agent dispersed throughout the matrix. The base-reactive, surface-modifying agent is reactive to hydroxide and increases the surface hydrophobicity of a pattern formed in a layer of the radiation-sensitive composition upon treatment with a basic developing solution during lithographic processing of a substrate.

19 Claims, No Drawings

COMPOSITION AND METHOD FOR REDUCING PATTERN COLLAPSE

FIELD OF THE INVENTION

The invention relates to a composition and method for reducing the probability of pattern collapse in lithographic processing. In particular, the invention relates to a composition and method for increasing the surface hydrophobicity of a radiation-sensitive composition upon treatment with a developing solution.

BACKGROUND OF THE INVENTION

The need to remain competitive in cost and performance in the production of semiconductor devices has caused a continuous increase in device density of integrated circuits. To accomplish higher integration and miniaturization in a semiconductor integrated circuit, miniaturization of a circuit pattern formed on a semiconductor wafer must also be accomplished.

Conventionally, circuit patterns are formed on semiconductor substrates using radiation-sensitive materials, such as photoresists, to fabricate an imaged pattern therein. The process of fabricating an imaged pattern includes forming layer of photoresist material on a semiconductor substrate, possibly followed by heating the layer of photoresist material to, for example, evaporate any solvent. The layer of photoresist is then subjected to a patterned exposure of radiation. After an optional post-exposure bake is performed, the exposed region of the layer of photoresist is developed using a basic developing solution. A deionized (DI) water rinse may wash away any undissolved particles left after the developing solution treatment to provide a patterned layer of photoresist on the substrate. Spin drying may be subsequently employed to remove any remaining droplets of deionized water. However, while this process for fabricating a patterned layer of photoresist is well-known and practiced, it does have its shortcomings as features get smaller and closer together.

For example, one shortcoming is the increased incidence of pattern collapse. Design rules, such as critical dimensions (CD), define the space tolerance between devices or interconnect lines so as to ensure that the devices or lines do not interact with one another in any unwanted manner. But an effect of decreasing critical dimension size is a corresponding increase in the force that causes pattern lines to collapse, as shown in the following relationship:

$$F = 6 \cdot \gamma \cdot \cos \theta \cdot (H/W)^2 \cdot (1/S) \qquad \text{Equation 1}$$

wherein F is the collapse force, is the surface tension of the rinsing liquid; $\theta$ is the contact angle of the rinse liquid on the material surface; H is the height of the line; W is the width of the line; and S is the spacing between the lines. As shown in Equation 1, increasing the height (H) of the line, decreasing the width (W) of the line or decreasing the spacing (S) between the photoresist lines produces an increase in the collapse force (F). Similarly, decreasing the contact angle ($\theta$) or increasing the surface tension ($\gamma$) of the rinsing liquid produces an increase in F. Herein, collapse force F is expressed in units of force per unit area, i.e. it is the bending stress to which the pattern is exposed during rinse.

Moreover, as a critical dimension gets smaller, the aspect ratio (H/W) of the pattern lines generally increases because the thickness (height) of the radiation-sensitive composition (e.g., photoresist) is generally based on factors such as etch resistance. Thus, it would appear that miniaturization of line patterns inherently increases the collapse force (F).

As such, several approaches toward reducing the collapse force (F) have focused on modifying the surface tension ($\gamma$) of the rinsing liquid. Tanaka et al., U.S. Pat. No. 5,374,502 and Reynolds, WO2005/010620 describe methods of using rinse liquids that contain one or more aliphatic alcohols, such as isopropanol, butanol, or pentanol. But these methods can produce over-development of the photo-resist layer or cause the collapse of the photo-resist line by dissolving the layers beneath the photo-resist layer. Lee et al., U.S. Pat. No. 7,238,653 describes using a surfactant, such as a phosphate-alcoholamine salt, to reduce the surface tension of the rinsing solution. But because a phosphate-alcoholamine salt is not volatile, the rinsing solution will leave a residue upon drying. So a cleaning rinse with DI water, which has high surface tension, would be necessary to remove the surfactant residue.

In view of the foregoing, there is a need for new methods of reducing pattern collapse.

SUMMARY OF THE INVENTION

According to an embodiment of the invention, there is provided a radiation-sensitive composition for use in lithographic processing. The composition comprises a bulk radiation-sensitive material matrix and a base-reactive, surface-modifying agent dispersed in the matrix that increases in hydrophobicity upon reaction with a basic developing solution.

According to another embodiment of the invention, there is provided a method for patterning a layer of radiation-sensitive composition with reduced probability of pattern collapse. The method comprises coating a radiation-sensitive composition on a substrate to form a layer, wherein the radiation-sensitive composition comprises a bulk radiation-sensitive material matrix and a base-reactive, surface-modifying agent dispersed in the matrix that increases in hydrophobicity upon reaction with a basic developing solution; exposing the layer of radiation-sensitive composition to a pattern of radiation to define an image pattern therein; and contacting the layer of radiation-sensitive composition with a basic developing solution to develop the image pattern and form a development pattern in the layer of radiation-sensitive composition, wherein the development pattern has a surface portion comprising a base-reactive, surface-modifying agent that has reacted with the basic developing solution thereby providing increased hydrophobicity at the surface portion.

Embodiments of the invention will be further appreciated in light of the following detailed description.

DETAILED DESCRIPTION OF THE INVENTION

A radiation-sensitive composition and method for patterning a substrate is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details.

Reference throughout this specification to "one embodiment" or "an embodiment" or variation thereof means that a particular feature, structure, material, or characteristic described in connection with the embodiment is included in at least one embodiment of the invention, but do not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Further, the use of the terms, "agent" or "agents" herein should be considered to be synonymous with the terms, "reagent" or "reagents," unless otherwise indicated. Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

According to embodiments of the present invention, there is provided a radiation-sensitive composition that comprises a bulk radiation-sensitive material matrix and a base-reactive, surface-modifying agent dispersed in the matrix that increases in hydrophobicity upon reaction with a basic developing solution.

The radiation-sensitive material, which forms the bulk matrix of the radiation-sensitive composition, is not particularly limited to any specific polymeric composition. For example, polymethylmethacrylate-based, polymethylglutarimide-based, phenol formaldehyde-based, or polyisoprene-based resins are suitable for use in various embodiments. Moreover, the radiation-sensitive material may be a positive-tone or negative-tone radiation-sensitive material. For example, the radiation-sensitive material may be a positive photoresist or negative photoresist.

The radiation-sensitive material may be sensitive to ultraviolet (UV) or extreme ultraviolet (EUV) radiation. For example, commonly-used UV radiation, such as 248 nm, 193 nm, or 157 nm, or extreme ultraviolet (EUV) radiation or a combination of two or more thereof, may be used to image the layer of radiation-sensitive composition.

According to embodiments of the invention, the base-reactive, surface-modifying agent is any agent that is capable of reacting with a basic (i.e., alkaline) developing solution under standard lithography conditions to render the surface of a layer of a radiation-sensitive composition comprising the base-reactive, surface modifying agent more hydrophobic. Thus, in accord with its designator, the base-reactive, surface-modifying agent contains a functional group that will react with the hydroxide ion of the basic developing solution.

Further, the base-reactive, surface-modifying agent is a component of a radiation-sensitive composition, so it would be beneficial for the agent to have additional characteristics, which include but are not limited to, an ability to be formulated in the radiation-sensitive composition without phase separation; to remain unchanged throughout the traditional lithographic process until exposed to a basic developing solution; and possess absorbance properties that do not negatively impact the absorbance of light by the radiation-sensitive material.

According to embodiments of the invention, the base-reactive, surface-modifying agent comprises one or more base-reactive functional groups. For example, a base-reactive functional group may be an ester, an amide, a β-alkoxy carbonyl, a β-alkoxy nitrile and the like. In accordance therewith, a base-reactive, surface modifying agent may be a cyclic compound that opens to an acyclic compound upon reaction with the basic developing solution. In one example, the base-reactive, surface-modifying agent further comprises a hydrophobic region having a first end and a second end, wherein the first and second ends of the hydrophobic section are connected through the one or more base-reactive functional groups to form a cyclic agent.

According to one embodiment, the base-reactive, surface-modifying agent comprises a poly-fluorinated C6 to C25 carbon chain portion having a ratio of fluorine atoms to carbon atoms sufficient to increase the hydrophobicity of the agent after reaction with the basic developing solution. The carbon chain may be branched, straight-chained, un-substituted or substituted. For example, the carbon chain may be substituted with non-polar groups, such as trifluoromethyl groups, ethers or silicon moieties.

Accordingly, in one embodiment, the ratio of fluorine atoms to carbon atoms may be greater than about 0.5. For example, the ratio of fluorine to carbon may be greater than about 1, greater than about 1.5, or greater than about 2. In one embodiment, the base-reactive, surface modifying agent comprises a perfluorinated compound.

An exemplary base-reactive, surface-modifying agent is a perfluorinated lactone (i.e., a cyclic ester) having between 6-18 atoms in the ring. For example, a base-reactive, surface-modifying agent may be a 14-membered perfluorinated lactone.

The base-reactive, surface modifying agent may be dispersed throughout the bulk matrix of the radiation-sensitive material by any suitable method. For example, the base-reactive, surface-modifying agent and the radiation-sensitive material may be combined in a compatible solvent or co-solvent to form a homogenous mixture or solution.

According to another embodiment of the invention, a method is provided for patterning a layer of radiation-sensitive composition with a reduced probability of pattern collapse. The method comprises coating a radiation-sensitive composition as described above on a substrate to form a layer, wherein the radiation-sensitive composition comprises the bulk radiation-sensitive material matrix and the base-reactive, surface-modifying agent dispersed in the matrix that increases in hydrophobicity upon reaction with a basic developing solution. The layer of radiation-sensitive composition is then exposed to a pattern of radiation to define an image pattern therein, followed by contacting the layer of radiation-sensitive composition with a basic developing solution to develop the image pattern and form a development pattern in the layer of radiation-sensitive composition. The development pattern has a surface portion comprising the base-reactive, surface-modifying agent at the surface that has reacted with the basic developing solution thereby increasing the hydrophobicity of the surface. To state another way, the development pattern has a reacted surface-modifying agent at a surface portion thereof, which surface portion exhibits an increased hydrophobicity relative to that of the radiation-sensitive composition containing the non-reacted surface-modifying agent prior to contact with the developing solution.

Accordingly, the radiation-sensitive composition is coated on a substrate to form a layer. The radiation-sensitive composition may be applied to the surface of the substrate by any means commonly-used in the art, such as spin coating, spray coating and the like. Thereafter, the applied layer may be heated to a temperature and for a time period sufficient to drive off any remaining solvent and/or co-solvent.

The layer of radiation-sensitive composition may be exposed or imaged with patterned radiation to define an image pattern in the layer. Thereafter, a post-exposure bake may be performed. For example, the bake process may be performed at a temperature ranging between about 50° C. to about 200° C.

The development of the imaged layer includes exposing the imaged layer of radiation-sensitive composition to a basic developing solution. A basic developing solution includes hydroxide ions. As such, suitable developers include those commonly used in the art, such as aqueous alkaline developers that contain tetramethylammonium hydroxide (TMAH).

According to one embodiment, the development of the imaged layer may include a negative-tone development, which is either directly or indirectly followed by exposing the remaining imaged portions of the imaged layer to a basic developing solution. According to another embodiment, the development of the imaged layer may include performing a positive-tone development with a basic developing solution. In either of the foregoing embodiments, the exposure of the imaged layer of radiation-sensitive composition to the basic developing solution may achieve two results. First, consistent with the positive-tone developing concept, areas of the imaged layer of radiation-sensitive composition having a high radiation exposure may be selectively removed by the basic developing solution. Second, in accord with the principles of the invention, the surface energy of the remaining sections of the radiation-sensitive composition may be rendered more hydrophobic by the exposure to the basic developing solution. Thus, with the base-reactive, surface-modifying agent dispersed throughout the layer of radiation-sensitive composition, both of the aforementioned results may be effectively achieved by the same treatment with a basic developing solution in a positive-tone development.

Without being bound by any particular theory, it is proposed that in positive-tone developing of the areas having high radiation exposure, the dissolution process dominates over the base-reactive, surface-modifying agent's propensity to increase hydrophobicity. In doing so, both the imaged radiation-sensitive material and the base-reactive, surface-modifying agent are removed to provide a development pattern in the layer of radiation-sensitive composition. But in the areas of low exposure, where the bulk radiation-sensitive material is not soluble in the basic developing solution, the base-reactive, surface-modifying agent may react with the hydroxide ions of the basic developing solution at the surface thereby rendering these regions more hydrophobic. In other words, the surface of the layer of radiation-sensitive composition corresponding to the low radiation exposure regions, which includes the surface of the pattern developed in the layer, such as a side-wall, are rendered more hydrophobic by the reacted form of the base-reactive, surface-modifying agent, which produces a change in the surface energy.

More specifically, the increased hydrophobicity of the surface of the radiation-sensitive composition causes a higher contact angle ($\theta$) with the basic developing solution and/or DI water. And thus, according to embodiments of the invention, the increased contact angle ($\theta$) provides a reduction in the collapse force (F), as shown by Equation 1 above. Consequently, with a reduction in the collapse force (F), the developed pattern has a reduced probability of collapsing, even as the pattern dimensions are minimized.

By virtue of the foregoing, there is thus provided a radiation-sensitive composition and a method of using the same in a lithographic process with reduced probability of pattern collapse. While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A radiation-sensitive composition for use in lithographic processing comprising a bulk radiation-sensitive material matrix and a base-reactive, surface-modifying agent dispersed in the matrix that increases in hydrophobicity upon reaction with a basic developing solution, wherein the base-reactive, surface modifying agent comprises a poly-fluorinated C6 to C25 carbon chain portion having a ratio of fluorine atoms to carbon atoms sufficient to increase the hydrophobicity of the agent after reaction with the basic developing solution.

2. The composition of claim 1, wherein the base-reactive, surface-modifying agent comprises a cyclic compound.

3. The composition of claim 2, wherein the cyclic compound is configured to open to an acyclic compound upon reaction with the basic developing solution.

4. The composition of claim of 1, wherein the base-reactive, surface-modifying agent comprises one or more base-reactive functional groups selected from the group consisting of ester, amide, $\beta$-alkoxy carbonyl, and $\beta$-alkoxy nitrile.

5. The composition of claim 4, wherein the base-reactive, surface-modifying agent further comprises a hydrophobic region having a first end and a second end, wherein the first and second ends of the hydrophobic section are connected through the one or more base-reactive functional groups to form a cyclic agent.

6. The composition of claim 1, wherein the ratio of fluorine atoms to carbon atoms is greater than about 0.5.

7. The composition of claim 6, wherein the ratio is greater than about 1.

8. The composition of claim 6, wherein the ratio is greater than about 1.5.

9. The composition of claim 6, wherein the ratio is about 2.

10. The composition of claim 1, wherein the base-reactive, surface modifying agent comprises a perfluorinated compound.

11. A method for patterning a layer of radiation-sensitive composition with reduced probability of pattern collapse, comprising:

coating a radiation-sensitive composition on a substrate to form a layer, wherein the radiation-sensitive composition comprises a bulk radiation-sensitive material matrix and a base-reactive, surface-modifying agent dispersed in the matrix that increases in hydrophobicity upon reaction with a basic developing solution, wherein the base-reactive, surface modifying agent comprises a poly-fluorinated C6 to C25 carbon chain portion having a ratio of fluorine atoms to carbon atoms sufficient to increase the hydrophobicity of the agent after reaction with the basic developing solution;

exposing the layer of radiation-sensitive composition to a pattern of radiation to define an image pattern therein; and contacting the layer of radiation-sensitive composition with the basic developing solution to develop the image pattern and form a development pattern in the layer of radiation-sensitive composition, wherein the development pattern has a surface portion comprising the base-reactive, surface-modifying agent that has reacted with the basic developing solution thereby increasing the hydrophobicity of the surface portion.

12. The method of claim 11 further comprising contacting the development pattern in the layer of radiation-sensitive composition with a rinse solution.

13. The method of claim 11 further comprising drying the development pattern in the layer of radiation-sensitive composition.

14. The method of claim 11, wherein the base-reactive, surface-modifying compound comprises a cyclic compound.

15. The method of claim 14, wherein the cyclic compound opens to an acyclic compound at the surface portion upon reaction with the basic developing solution.

16. The method of claim 11, wherein the base-reactive, surface-modifying agent comprises one or more base-reactive functional groups selected from the group consisting of ester, amide, β-alkoxy carbonyl and β-alkoxy nitrile.

17. The method of claim 11, wherein the ratio of fluorine atoms to carbon atoms is greater than about 0.5.

18. The method of claim 17, wherein the ratio is greater than about 1.

19. The method of claim 17, wherein the base-reactive, surface modifying agent comprises a perfluorinated compound.

* * * * *